United States Patent [19]
Aspar et al.

[11] Patent Number: 6,110,802
[45] Date of Patent: *Aug. 29, 2000

[54] PROCESS FOR PRODUCING A STRUCTURE WITH A LOW DISLOCATION DENSITY COMPRISING AN OXIDE LAYER BURIED IN A SEMICONDUCTOR SUBSTRATE

[75] Inventors: Bernard Aspar, Rives; Jacques Margail, La Tronche; Catherine Pudda, Seyssinet, all of France

[73] Assignee: Commissariat a l'Energie Atomique, Paris, France

[*] Notice: This patent issued on a continued prosecution application filed under 37 CFR 1.53(d), and is subject to the twenty year patent term provisions of 35 U.S.C. 154(a)(2).

[21] Appl. No.: 08/737,812
[22] PCT Filed: May 17, 1995
[86] PCT No.: PCT/FR95/00644
  § 371 Date: Mar. 31, 1997
  § 102(e) Date: Mar. 31, 1997
[87] PCT Pub. No.: WO95/31825
  PCT Pub. Date: Nov. 23, 1995

[30] Foreign Application Priority Data

May 18, 1994 [FR] France .................. 94 06061

[51] Int. Cl.$^7$ ................................. H01L 21/76
[52] U.S. Cl. ................. 438/440; 438/370; 438/373
[58] Field of Search .................. 438/440, 370, 438/373

[56] References Cited

PUBLICATIONS

Stanley Wolf *Silicon Processing for the VSLI Era* vol. 1 Lattice Press p. 157, 1986.
Stanley Wolf *Silicon Processing for the VSLI Era* vol. 1 Lattice Press p. 305, 1986.
Buczkowski et al *Conductivity–Type Conversion in Multiple–Implant/Multiple–Anneal SOI IEEE Transactions* vol. 38, Jan. 1991.

*Primary Examiner*—Charles Bowers
*Assistant Examiner*—David S Blum
*Attorney, Agent, or Firm*—Burns, Doane, Swecker & Mathis, L.L.P.

[57] ABSTRACT

Process for producing a structure having a low dislocation density comprising an oxide layer buried in a semiconductor substrate. This process for producing an epitaxied structure with a low dislocation density has the structure incorporating an oxide layer (6) in a substrate (4) made from a semiconductor material and successively involves at least one implantation of oxygen ions in the substrate (4), at least one first conditioning heat treatment of the substrate, an epitaxy of a layer (14) of a semiconductor material on the substrate and a second heat treatment for eliminating dislocations (8) from the structure.

22 Claims, 3 Drawing Sheets

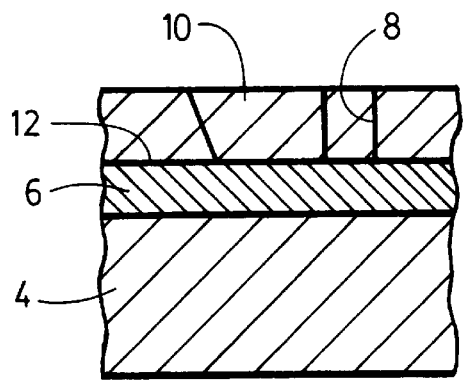
FIG._1.
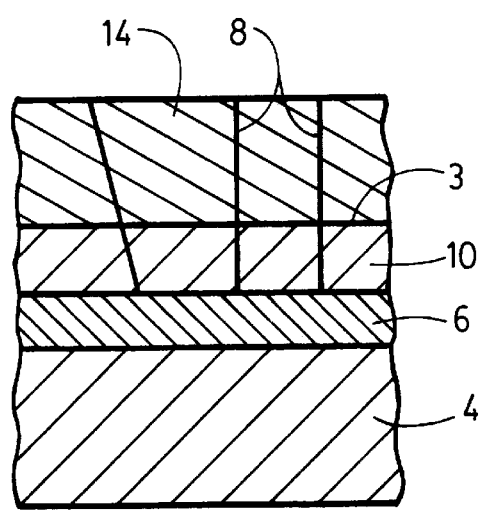
FIG._2.
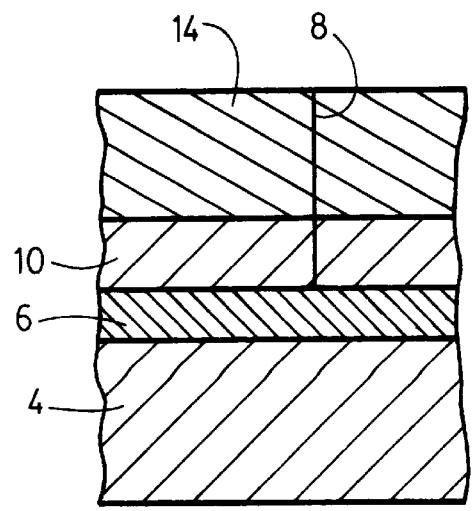
FIG._3.

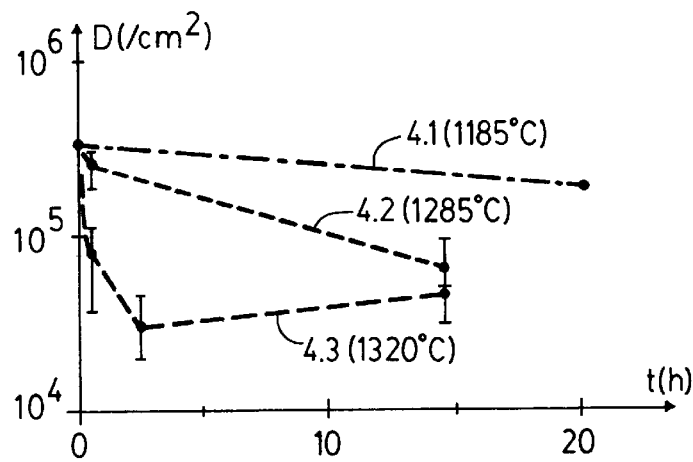
FIG._4.
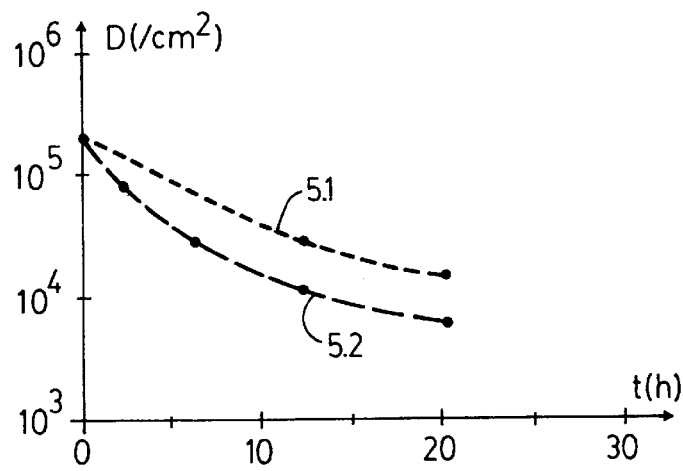
FIG._5.
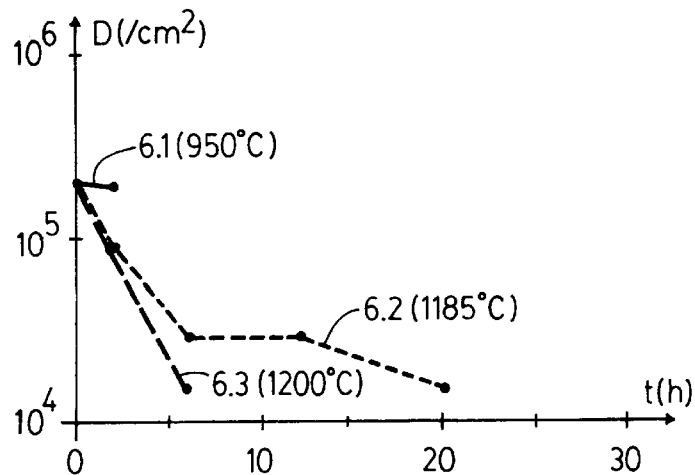
FIG._6.

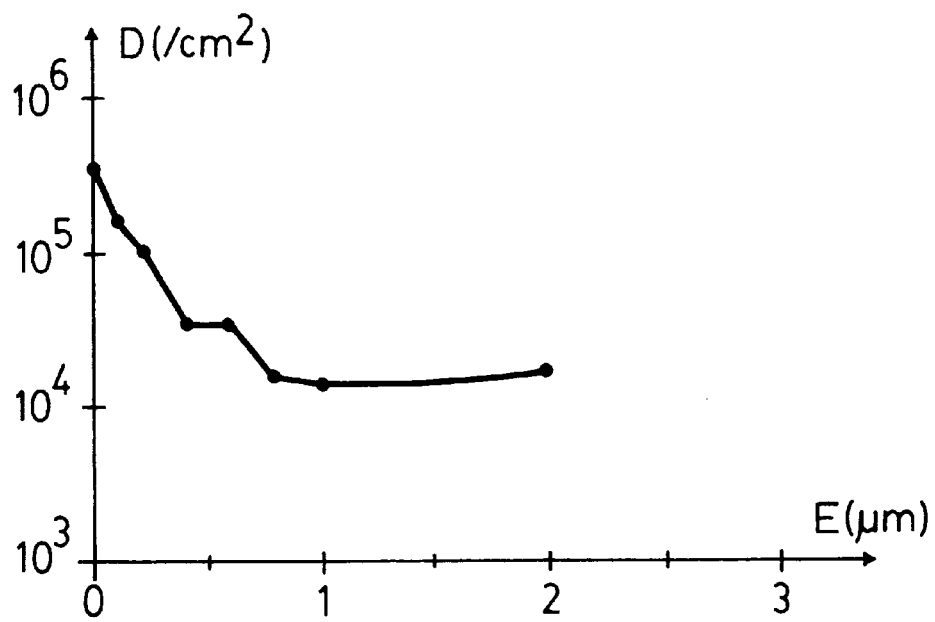
FIG._7.
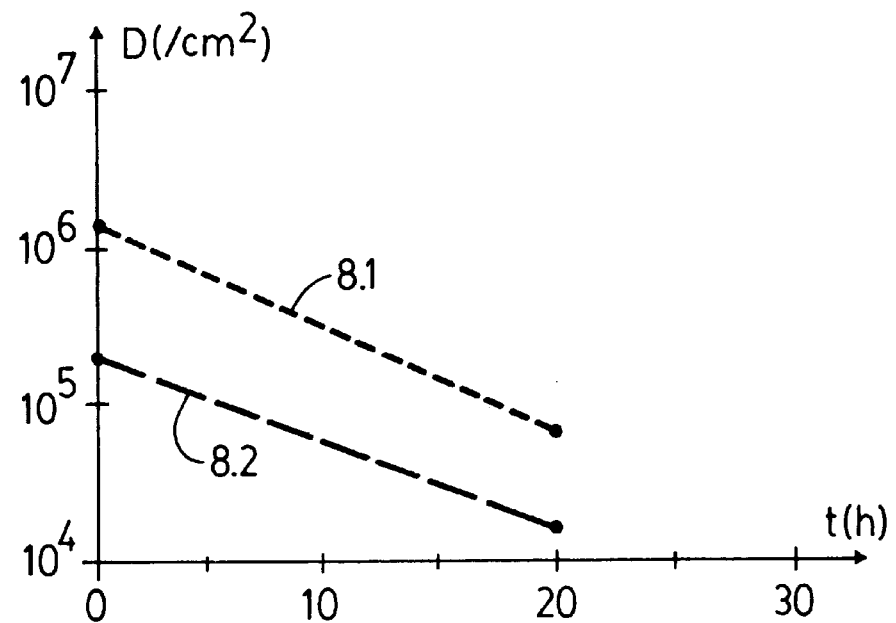
FIG._8.

PROCESS FOR PRODUCING A STRUCTURE WITH A LOW DISLOCATION DENSITY COMPRISING AN OXIDE LAYER BURIED IN A SEMICONDUCTOR SUBSTRATE

TECHNICAL FIELD

The present invention relates to a process for producing a structure having a low dislocation density comprising an oxide layer buried in a semiconductor substrate. It more specifically relates to the production of silicon on insulator or SOI structures using an oxygen implantation process known as Separation by IMplantation of OXygen or SIMOX. The invention has numerous applications in microelectronics and in particular in the production of integrated circuits of the Complementary Metal-Oxide Semiconductor or CMOS type.

PRIOR ART

For the development of technologies relating to SOI structures with the SIMOX process, one of the main aims is the reduction of the density of crystal defects.

Crystal defects and in particular dislocations of SOI structures of the SIMOX type constitute certain of the main disadvantages thereof. SOI structures have a silicon film, whose crystal imperfections constitute an obstacle or at least a limitation with respect to the production of certain components or circuits.

This is in particular true for components of the bipolar type, junction field effect transistors (JFET) and for applications of advanced technologies of the CMOS ULSI (Ultra Large Scale Integration) type, where integration densities are very important.

Documents (1), (2) and (3), described at the end of the description, give examples of the behaviour of defects of structures of the SOI type following the epitaxy of a semiconductor material layer.

Liaw et al (document (1)) concludes that silicon epitaxy makes it possible to moderately reduce the defect density in the silicon film by trapping dislocations between them (from $2.5.10 \text{ cm}^{-2}$ to $4.10^6 \text{ cm}^{-2}$ for an epitaxy of 18.2 $\mu$m). This mechanism is only effective in the case of high defect densities. A simple calculation, considering an inclination of dislocations of 35° relative to the perpendicular, shows that for an epitaxy of 1 $\mu$m, the defect density must exceed $2.10^7 \text{ cm}^{-2}$ so that there is a non-zero probability of interaction between two dislocations. Liaw et al conclude that the quality of the layer formed is not dependent on the pre-epitaxy heat treatments.

Document (2) arrives at an identical conclusion showing that on a sample having a high dislocation density ($10^9 \text{ cm}^{-2}$) an epitaxy of a layer 5 $\mu$m thick makes it possible to obtain a slightly lower dislocation density ($10^8 \text{ cm}^{-2}$).

These different studies indicate that for high dislocation densities ($>10^7 \text{ cm}^{-2}$), the epitaxy of a significant silicon thickness ($>4 \mu$m) makes it possible to slightly reduce the dislocation density, whereas for low epitaxied silicon thicknesses no defect density modification occurs (document (3)).

Thus, in all cases, the only mechanism used is the trapping of the dislocations between them.

It would appear that the dislocations in the structures obtained by the SIMOX process essentially have two origins, which are on the one hand the surface state of the substrate and on the other the state of the disturbed area at the interface between the buried layer and the semiconductor material.

An object of the invention is to propose a process making it possible to obtain a structure with a dislocation density very significantly below those of the known structures.

DESCRIPTION OF THE INVENTION

To this end, the invention more particularly relates to a process for producing an epitaxied structure with a low dislocation density, said structure comprising an oxide layer in a semiconductor material substrate, the process successively involving:

- at least one implantation of oxygen ions in the substrate through a surface of the latter in order to form a buried oxide layer,
- at least one first conditioning heat treatment of the substrate at a temperature below the melting point of the semiconductor material,
- an epitaxy of a semiconductor material layer on the substrate surface and
- a second heat treatment at a temperature lower than the melting point of the semiconductor material of the substrate and that of the material of the epitaxied layer in order to eliminate most of the dislocations of the structure in an unstable energy configuration,
- at least one of the first and second heat treatments being performed at a temperature making it possible to substantially dissolve all the oxide precipitates formed during the implantation, in order to free the dislocations which then recombine during the second heat treatment.

Oxygen implantation in the substrate forms the basic stage of the SIMOX process. Accelerated oxygen ions are implanted either in their atomic form $O^+$ or in their molecular form $O_2^+$. Implantation can take place in either one or several stages. In this case, the implantation stages alternate with annealing processes, which amounts to repeating and alternating several times the stages of implantation and the first heat treatment of the process. Reference can be made in this connection to document (4) at the end of the description.

The process of the invention essentially involves the association of stages of at least one first heat treatment, epitaxy and the second heat treatment. Each of these stages is essential and determinative for the efficiency of the process.

The first heat treatment, also called preannealing, makes it possible to condition the material. Conditioning of the material is understood to mean that a certain number of modifications such as a redistribution of the implanted oxygen, a redistribution of certain dislocations already present in the material and a release of a certain number of stresses are induced. This can also give rise to new dislocations. This first treatment or pre-annealing can, in the process, appear as one or more independent stages and/or forms part of the epitaxy process. The first heat treatment is likened in the latter case to a stage of conditioning, preparation and cleaning of the material prior to epitaxy, said stage being performed by heating the substrate under a controlled atmosphere.

Following the first heat treatment, the surface state of the substrate is adequate to permit a good quality epitaxy. The semiconductor material used for the epitaxy is preferably the same as the material of the substrate in which the oxygen is implanted and in particular this material is silicon for a silicon substrate. Obviously, other materials may be used.

The crystal defects issuing on the surface of the substrate are propagated in the layer formed by epitaxy. The dislocations traverse said layer and their length increases with its thickness.

The energy of a dislocation, which is directly proportional to its length, consequently increases during epitaxy. Therefore the epitaxy does not modify the dislocation density, but instead places said dislocations in an unstable energy configuration. It should be noted in this connection that it is desirable for the epitaxy layer to have a thickness of at least 0.05 μm and preferably approximately 1 micrometre, so as to obtain a significant reduction of the dislocations.

According to a feature of the invention, at least one of the first and second heat treatments can be performed at a temperature equal to or above 1200° C. and preferably approximately 1300° C. As a result, particularly for a silicon structure, it is possible to have a dislocation density below $10^5$ dislocations/cm$^2$.

The second heat treatment supplies the energy necessary for the system to evolve towards a lower energy state by eliminating most of the dislocations occurring in an unstable configuration. This phenomenon is thermally activated and consequently the higher the temperature the greater the effect. In exemplified manner, for silicon epitaxied on silicon, annealing at 1320° C. for 6 hours, following the epitaxy stage, permits the dislocation density to be reduced by at least a factor of ten.

Other features and advantages of the invention can be better gathered from the following illustrative and non-limitative description with reference to the attached drawings.

BRIEF DESCRIPTION OF THE DRAWINGS

FIG. 1 diagrammatically illustrates the structure resulting from an implantation of ions in a substrate and following a first heat treatment.

FIG. 2 diagrammatically illustrates an epitaxy stage of a silicon layer according to the invention.

FIG. 3 diagrammatically illustrates the final structure obtained after a second heat treatment.

FIG. 4 is a graph expressing the dislocation density in cm$^{-2}$ of the final structures as a function of the duration of the first heat treatment in hours and for different temperatures of the first heat treatment.

FIG. 5 is a graph expressing the dislocation density in cm$^{-2}$ of final structures as a function of the duration of the first heat treatment in hours and for structures having undergone an epitaxy under different conditions.

FIG. 6 is a graph expressing the dislocation density in cm$^{-2}$ of final structures as a function of the duration of the first heat treatment in hours and for different heat treatment temperatures, the epitaxy of the structures having been performed under different conditions from that of the structures of FIG. 4.

FIG. 7 is a graph expressing the dislocation density in cm$^{-2}$ of the final structures as a function of the epitaxy layer thickness in μm.

FIG. 8 is a graph expressing the dislocation density in cm$^{-2}$ of final structures as a function of the duration of the first heat treatment in hours with substrates of different crystal qualities.

DETAILED DESCRIPTION OF EMBODIMENTS OF THE PROCESS

FIG. 1 illustrates the structure obtained after implantation and the first heat treatment according to the process of the invention.

The first stage of the process consists of implanting oxygen ions $O^+$ or $O_2^+$ in a substrate 4, e.g. monocrystalline silicon, across a surface 3 in order to form a buried oxide layer 6.

As a function of the particular case, the layer can vary from a zone constituted by small oxygen aggregates embedded in the silicon to a continuous zone. The oxygen implantation dose is preferably above $10^{15}$ cm$^{-2}$ and is e.g. approximately $1.8.10^{18}$ cm$^{-2}$ under current conditions. The implantation energy is approximately 200 keV. Under these conditions, following the first heat treatment, it is possible to obtain a buried layer with a thickness of 400 nm.

The second stage of the process consists of a first heat treatment of the structure which now incorporates the buried oxide layer 6 subdividing the substrate into two parts, namely a silicon film 10 and the substrate mass 4.

During said second or preannealing, the structure is raised to a temperature below the melting point of the semiconductor, but adequate for conditioning the substrate and is e.g. 1320° C. and the duration is 6 hours. It should be noted that the temperature is not critical per se in the first heat treatment and can vary between approximately 800 and 1405° C. The lower the temperatures used, the longer the heat treatment period.

The same result can be obtained with heat treatments at different temperatures, but adapting the duration of the treatment.

As a function of the temperature, different mechanisms may appear. For intermediate heat treatment temperatures of approximately 950 to 1200° C., only small silica precipitates present following oxygen implantation are dissolved. At the Si/SiO$_2$ interface 12 there are also large precipitates between which are trapped numerous dislocations. The only dislocations issuing onto the surface are those resulting from reconstruction defects during oxygen implantation 2, or those emanating from the defect zone close to the interface 12. This zone is sufficiently close to the surface to induce through dislocations after annealing. For higher heat treatment temperatures exceeding 1300° C., there are no longer silica precipitates in the silicon film and the dislocations 8 are all of a through nature with a density from $10^5$ to $10^6$ cm$^{-2}$ for the standard SIMOX process ($1.8.10^{18}$ O$^+$ions/cm$^2$). The high temperature heat treatment supplies the system with the thermal activation enabling it to evolve towards a thermodynamic equilibrium (metastable).

As indicated hereinbefore, this evolution is accompanied by a release of certain stresses, resulting in a redistribution of the dislocations 8 or the appearance of new dislocations.

The following stage of the process is illustrated in FIG. 2. A silicon layer 14 is formed by epitaxy on the face 3 of the substrate 4 in which has been formed beforehand the buried oxide layer 6.

The thickness of the layer 14 is e.g. 1 μm and always exceeds 0.05 μm so that the process has an adequate effectiveness. It would appear that dislocations 8 issuing onto the surface 3 are extended during epitaxy into the layer 14.

When the state of the surface 3 of the substrate through which the oxygen ions are implanted is correctly controlled, particularly with regards to contamination problems, the presence or absence of oxygen and the crystal orientation, the dislocation density is approximately $10^5$ cm$^{-2}$, the main source of crystal defects being dislocations increasing with the epitaxy layer 14 from the disturbed zone at the interface 12 of the oxide layer 6 and the silicon film 10.

After epitaxy, the complete structure undergoes the second heat treatment to finally obtain the result of FIG. 3, which shows a small number of dislocations 8, whose length has increased during epitaxy and whose energy configuration has become unstable, said dislocations disappearing during this treatment.

This second heat treatment takes place in a temperature range from 800 to 1400° C., the treatment times also varying as a function of the chosen temperatures. The structure is e.g. exposed to a temperature of 1320° C. for about 6 hours.

In order to better illustrate the importance of the different parameters referred to hereinbefore, it is now appropriate to analyze their influence on the number of dislocations in the different experimental configurations. As mentioned hereinbefore, the time-temperature pair of the first heat treatment is of very great importance.

As a function of the duration of the first heat treatment, the graph of FIG. 4 indicates on the abscissa and in hours, the number D of dislocations per $cm^2$ present in the final structure on the ordinate for temperatures of the first heat treatment respectively equal to 1185° C. (4.1), 1285° C. (4.2) and 1320° C. (4.3). These measurements were made on a sample with a thickness of the layer 14 of 1 μm formed in a barrel-type frame, at a pressure of approximately $1.2.10^3$ Pa (90 torrs) and which underwent a second heat treatment at 1320° C. for 6 hours. It would appear that both the duration and the temperature of the first heat treatment influence the decrease in the final number of dislocations.

A particularly interesting result is obtained with a first heat treatment at 1320° C. for 6 hours, which leads to a final structure with a dislocation density reduced by a factor of approximately 10.

It would appear that for a temperature of the first heat treatment of 1185° C., there is only a very small reduction in the number of dislocations. As will become apparent hereinafter, this result is largely due to the epitaxy conditions (equipment, process).

This is more particularly shown in FIG. 5 indicating as a function of the duration of the first heat treatment on the abscissa, the dislocation density D in the final structure following the second heat treatment on the ordinate.

In the tests of FIG. 5, the first heat treatment was performed at 1185° C., the second heat treatment at 1320° C. for 6 hours and the epitaxy layer is 1 μm thick.

Curves 5.1 and 5.2 represent results obtained with structures where the epitaxy layer was respectively produced in a barrel-type frame operating at low pressure and in a "monowafer" type frame at atmospheric pressure.

It would appear that no matter what the epitaxy implementation mode the process is functional. However, the thermal budget, i.e. the temperature-time pair of the first heat treatment necessary for finally obtaining an effective reduction of the number of dislocations can vary as a function of the epitaxy conditions.

Whereas in FIG. 4 the reduction of the dislocations was low for a treatment at 1185° C., it is higher by a factor of 10 in the case of curves 5.1 and 5.2 of FIG. 5, for an equivalent first treatment duration (20 hours). These differences in the results are in particular due to different epitaxy conditions (gas types, prebake, temperature rise, etc.).

Thus, it should be noted in this connection that the epitaxy process can involve a surface preparation heat treatment or prebake, which can influence or modify the first heat treatment of the invention.

Although the temperature of the first heat treatment is not in itself a determinative factor for the efficiency of the process, provided that it is adequate for conditioning the substrate according to the invention, it would appear relative to FIG. 6 that the effectiveness of the process increases with the temperature of the first heat treatment. FIG. 6 expresses on the ordinate the final dislocation density $D/cm^2$ of structures which have respectively undergone a first treatment at 950° C. (curve 6.1), 1185° C. (6.2) and 1200° C. (6.3).

The duration of the first heat treatment is shown on the abscissa and is expressed in hours. The epitaxy stage was performed in a monowafer-type frame at atmospheric pressure, with a 1 μm thick epitaxied layer. The duration of the second heat treatment is maintained at 6 hours with a temperature of 1320° C. Under these conditions, a first heat treatment at 950° C. for 2 hours is inadequate for observing a significant reduction in the dislocation density in the final structure. However, for treatments at 1185 and 1200° C., the reduction of the dislocations rapidly becomes significant.

It is also clear from comparing FIG. 6 and FIGS. 4/5 that for a first treatment at 1185° (4.1, 5.2 and 6.2), very different results are observed. This is particularly due to the fact that the epitaxy was carried out under different conditions for the tests corresponding to these graphs.

A performance example of the process using a silicon structure and in which the first and second heat treatments are performed at 1300° C. provides a better understanding and offers an explanation of the influence of the temperature on the dislocation elimination mechanism.

In this example, following an oxygen implantation and a first heat treatment at 1300° C., the dislocations present in the upper silicon film are all of a through nature and their ends are located at the surface and at the $Si/SiO_2$ interface.

Study of these dislocations by chemical developing indicates that they are in pairs. These pairs are oriented in accordance with very specific, preferred directions. This configuration is stable, because a second heat treatment does not modify the configuration of the dislocations. Thus, there are interaction forces between two dislocations forming a pair.

After epitaxy, the dislocations are still in pairs and their density is still the same. However, the pairs no longer have a preferred orientation. Thus, the epitaxy has modified the configuration of the dislocations and has permitted a significant reduction in the interaction forces between the dislocations forming a pair. The dislocations are then in an unstable configuration. It is then merely necessary to carry out the second heat treatment in order to give energy to the system and bring about an evolution towards a lower energy state. During this second heat treatment, the dislocations can migrate and certain dislocations may recombine. There is then a reduction of the dislocation density.

During this process, there is an elimination of dislocations by recombination. For this purpose, it is necessary that these dislocations can migrate, i.e. that they are not trapped on a defect, such as e.g. an oxide precipitate in the upper silicon film. This demonstrates the importance of performing at least one of the two heat treatments during the process at an adequate temperature to ensure that all the oxide precipitates ($SiO_2$) are dissolved.

Another parameter which can influence the process result is the thickness of the epitaxy layer. As indicated hereinbefore, the object of epitaxy is to increase the length of the dislocations, so as to place them in an unstable energy configuration.

To evaluate the influence of the thickness of the epitaxy layer, tests were carried out in a monowafer-type frame and at atmospheric pressure with a first heat treatment at 1185° C. for 20 hours and a second heat treatment at 1320° C. for 6 hours. FIG. 7 shows on the ordinate the dislocation density/$cm^2$ for different structures with different epitaxy layer thicknesses (on the abscissa in μm).

The measurements show that even if the process gives results for relatively thin epitaxy layers, a significant reduction of the dislocation density is reached with structures where the layer thickness is approximately 1 micrometre or higher.

FIG. 8 reveals the influence of the quality of the starting material, i.e. the substrate used. It indicates as a function of the duration of the first heat treatment in hours, the final dislocation density $D/cm^2$, i.e. after the second heat treatment for a sample (curve 8.1), whose initial dislocation density, i.e. preceding said second heat treatment, was approximately $10^6$ $cm^{-2}$, and a sample (curve 8.2), whose initial dislocation density was approximately $10^5$ $cm^{-2}$. The second heat treatment was performed at 1320° C. for 6 hours and the epitaxy with a thickness of 1 µm was performed in a monowafer-type frame at atmospheric pressure. It would appear that in each of the cases with a first heat treatment at 1185° C. for 20 hours, the dislocation density has decreased by at least a factor of 10.

Finally, due to the process of the invention, it is possible to obtain SOI structures with a high crystal quality. The choice of certain parameters and in particular the temperature also optimizes the process for different production installations for such structures, which permits the easy and economic performance thereof in numerous applications.

The following documents are referred to in the present description:

Document (1):

Defect Phenomena in SIMOX Through Epitaxy, H. Min Liaw, M. Tomozane, and P. Fejes, Proc. of the 1990 Electrochem. Soc. Spring Meeting, Montreal, Quebec, Canada, May 8–11, p 129.

Document (2):

A. Mogro-Campero, N. Lewis and S. A. Al-Marayati Mat. Res. Soc. Symp. Proc., vol. 107, 1988, p 123 ssq.

Document (3):

Silicon Epitaxial Growth on Silicon on insulator structures by rapid thermal processing chemical vapor deposition, T. Y. Hsieh, Kith Jung and D. L. Kwong, Appl. Phys. Lett. 57(23), December 3, 1990.

Document (4):

French patent application FR-A-2 616 590.

What is claimed is:

1. Process for producing an epitaxied structure with a low dislocation density, said structure comprising an oxide layer (6) in a semiconductor material substrate (4), the process comprising the following successive steps:

(a) at least one implantation of oxygen ions (2) in the substrate (4) through a surface (3) of the latter in order to form a buried oxide layer whereby oxide precipitates are formed during implantation, (b) at least one first conditioning heat treatment of the substrate at a temperature below the melting point of the semiconductor material wherein dislocations (8) are present on a surface of the substrate, (c) forming an epitaxial layer (14) of a semiconductor material having a thickness equal to or greater than 0.05 µm on the substrate surface by epitaxial growth whereby the dislocations (8) become extended into the epitaxial layer (14) during the epitaxy growth, and (d) following step (c), a second heat treatment at a temperature that is lower than the melting point of the semiconductor material of the substrate and that of the material of the epitaxied layer (14) said second heat treatment being carried out at a temperature and for a duration effective to eliminate most of the dislocations in the epitaxied layer that are in an unstable energy configuration, wherein at least one of the first and second heat treatments is performed at a temperature equal to or above 1200° C. to substantially dissolve all the oxide precipitates formed during implantation, to free the dislocations (8) to form free dislocations and to allow the free dislocations to recombine during the second heat treatment to obtain an epitaxied structure having a dislocation density of below $10^5$ dislocations/$cm^2$.

2. Process according to claim 1, characterized in that the semiconductor material is silicon.

3. Process according to claim 2, characterized in that the first treatment takes place at a temperature chosen within the temperature range 800 to 1405° C.

4. Process according to claim 2, characterized in that the second heat treatment takes place at a temperature between 800 and 1405° C.

5. Process according claim 1, characterized in that at least one of the first and second heat treatments is performed at a temperature equal to or above 1200° C.

6. Process according to claim 1, characterized in that the epitaxy layer of semiconductor material has a thickness equal to or greater than 1.0 µm.

7. Process according to claim 3, characterized in that the second heat treatment takes place at a temperature between 800 and 1405° C.

8. Process according to claim 4, characterized in that at least one of the first and second heat treatments is performed at a temperature equal to or above 1300° C.

9. Process according to claim 5, characterized in that the epitaxy layer of semiconductor material has a thickness equal to or greater than 1.0 µm.

10. Process according to claim 1 wherein at least one of the first and second heat treatments is performed at approximately 1300° C.

11. Process according to claim 4 wherein at least one of the first and second heat treatments is performed at approximately 1300° C.

12. Process for producing an epitaxial structure with a low dislocation density, said structure comprising an oxide layer (6) in a semiconductor material substrate (4), the process comprising the following successive steps:

(a) at least one implantation of oxygen ions (2) in the substrate (4) through a surface (3) of the latter in order to form a buried oxide layer whereby oxide precipitates are formed during implantation, (b) at least one first conditioning heat treatment of the substrate at a temperature below the melting point of the semiconductor material wherein dislocations (8) are present on a surface of the substrate, (c) forming an epitaxial layer (14) of a semiconductor material on the substrate surface by epitaxial growth whereby the dislocations (8) become extended into the epitaxial layer (14) during epitaxial growth, and (d) following step (c), a second heat treatment at a temperature that is lower than the melting point of the semiconductor material of the substrate and that of the material of the epitaxial layer (14) said second heat treatment being carried out at a temperature and for a duration effective to eliminate most of the dislocations of structure that are in an unstable energy configuration, wherein at least one of the first and second heat treatments is performed at a temperature to substantially dissolve all the oxide precipitates formed during the implantation, to free the dislocations (8) and to allow the free dislocations to recombine during the second heat treatment in order to obtain an epitaxial structure having a dislocation density of below $10^5$ dislocations/cm$^2$.

13. Process according to claim 12, characterized in that the semiconductor material is silicon.

14. Process according to claim 13, characterized in that the first treatment takes place at a temperature chosen within the temperature range 800 to 1405° C.

15. Process according to claim 13, characterized in that the second heat treatment takes place at a temperature between 800 and 1405° C.

16. Process according claim 12, characterized in that at least one of the first and second heat treatments is performed at a temperature equal to or above 1200° C.

17. Process according to claim 12, characterized in that the epitaxial layer of semiconductor material has a thickness equal to or greater than 0.5 µm.

18. Process according to claim 14, characterized in that the second heat treatment takes place at a temperature between 800 and 1405° C.

19. Process according to claim 15, characterized in that at least one of the first and second heat treatments is performed at a temperature equal to or above 1200° C.

20. Process according to claim 16, characterized in that the epitaxial layer of semiconductor material has a thickness equal to or greater than 0.5 µm.

21. Process according to claim 12 wherein at least one of the first and second heat treatments is performed at approximately 1300° C.

22. Process according to claim 16 wherein at least one of the first and second heat treatments is performed at approximately 1300° C.

* * * * *